United States Patent [19]

Takemura

[11] Patent Number: 5,015,621

[45] Date of Patent: May 14, 1991

[54] SEDIMENTATION METHOD FOR FORMING BI-CONTAINING SUPERCONDUCTING FILMS

[75] Inventor: Yasuhiko Takemura, Atsugi, Japan

[73] Assignee: Semiconductor Energy Laboratory Co., Ltd., Kanagawa, Japan

[21] Appl. No.: 356,536

[22] Filed: May 24, 1989

[30] Foreign Application Priority Data

Jun. 2, 1988 [JP] Japan .................. 63-137085

[51] Int. Cl.$^5$ .................. B05D 5/12
[52] U.S. Cl. .................. 505/1; 505/782; 505/725; 427/62; 427/73
[58] Field of Search .................. 505/1, 725, 782; 427/62, 63, 73

[56] References Cited

U.S. PATENT DOCUMENTS

| 4,455,323 | 6/1984 | Ishizuka et al. | 427/65 |
| 4,540,599 | 9/1985 | Rabatin | 427/65 |
| 4,746,588 | 5/1988 | Ditty et al. | 430/23 |

FOREIGN PATENT DOCUMENTS

| 52-68360 | 6/1977 | Japan | 427/73 |
| 64-12424 | 1/1989 | Japan . | |

OTHER PUBLICATIONS

Hewat et al., "Superstructure of the superconductor $Bi_2Sr_2CaCu_2O_8$ by High-Resolution Electron Microscopy", Nature, vol. 333, May 1988, pp. 53–54.

Hazen et al., "Superconductivity in the High-$T_c$Bi-Ca-Sr-Cu-O System: Phase Identification", Phys. Rev. Lett., vol. 60 (12), Mar. 1988, pp. 1174–1177.

Hashimoto et al., "Superconductivity and Substrate Interaction of Screen-Printed Bi-Sr-Ca-Cu-O Films", Jpn. J. Appl. Phys. 27(3), Mar. 1988, pp. L384-L386.

Rice et al., "Preparation of Superconducting Thin Films of Calcium Strontium Bismuth Copper Oxides by Coevaporation", Appl. Phys. Lett. 52(21), May 23, 1988, pp. 1828–1830.

Steinbeck et al., "Preparation of Superconducting Bi-Sr-Ca-Cu-O Thin Films by Sequential Electron Beam Evaporation and Oxygen Annealing", Appl. Phys. Lett., vol. 54(5), Jan. 1989, pp. 466–468.

Primary Examiner—Norman Morgenstern
Assistant Examiner—Roy V. King
Attorney, Agent, or Firm—Sixbey, Friedman, Leedom & Ferguson

[57] ABSTRACT

A superconducting ceramic powder of Bi/Sr/Ca/Cu/O system are formed in a film and the c-axes are uniformly aligned with the normal of the film. The alignment of the axes is accomplished by dripping ethylalcohol containing the ceramic powder into ethyl alcohol contained in a reservoir. The ceramic powder is settled on a substrate arranged in the reservoir in film form. After removing ethylalcohol, the ceramic film is fired.

10 Claims, 2 Drawing Sheets

SEDIMENTATION METHOD FOR FORMING BI-CONTAINING SUPERCONDUCTING FILMS

BACKGROUND OF THE INVENTION

The present invention relates to a manufacturing method of superconducting ceramic films, and more particularly relates to an improved method of forming superconducting ceramic films having a relatively increased thickness without superconducting property.

The high-temperature ceramic superconductors discovered in the last couple of years are demonstrating potential for a variety of applications. The ceramic materials of this kind exhibit strong anisotoropy. In the crystalline structure of the ceramics, superconducting current tends to flow along the a-axis and the b-axis, i.e. to flow on the (a b) plane, but the current flow along the c-axis is unlikely. For this reason, it is important to align the c-axes of crystals throughout the ceramic material in the direction in which superconducting current would be desired to pass through in use thereof. The alignment of the crystalline axes is an important technique of the formation of ceramic superconductors.

The alignment of crystalline axes is particularly difficult in case of the formation of thin film. When the thickness of the films is of the order of several micrometers, the formation could be carried out by sputtering, electron beam evaporation, MBE or similar methods. When the thickness, however, is desired to be several hundreds micrometers, e.g. for use in power devices such as power storage devices, the axes inevitably fluctuate to a substantial extent.

SUMMARY OF THE INVENTION

It is therefore an object of the present invention to form superconducting films having their thickness of the order of hundreds micrometers or higher.

In order to accomplish the above and other objects and advantages, a fine powder of raw superconducting ceramic material is dispersed in a liquid compatible with the powder, e.g. an organic solvent such as an alcohol or an acetone and dripped into a pool of an organic liquid in which a substrate to be coated is placed. The fine powder is gradually settled on the surface of the substrate. Since ceramic superconductors, particularly B/S/C/C/O system materials, tend to cause cleavage, the particles of the fine powder are substantially aligned on the surface. The gradual settlement of the powder is accomplished by decreasing the particle size and dispersing the powder in a suitable solvent.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Prescribed amounts of powders of $Bi_2O_3$, $SrCO_3$, $CaCO_3$ and $CuO$ of 99.9% or higher purity respectively were sufficiently mixed in ethylalcohol, dried and fired at 800° C. for 12 hours. The proportions of the chemicals were selected in agreement with a stoichiometric formation of $Bi_2Sr_2CaCu_2O_{8+x}$. The fired ceramic material was ground to have a powder average size of 1 micrometer or less. It was confirmed that the fine powder was in single phase of BSCCO by the x-ray analysis. The fine powder was added to and mixed with ethylalcohol again.

Figure 1:
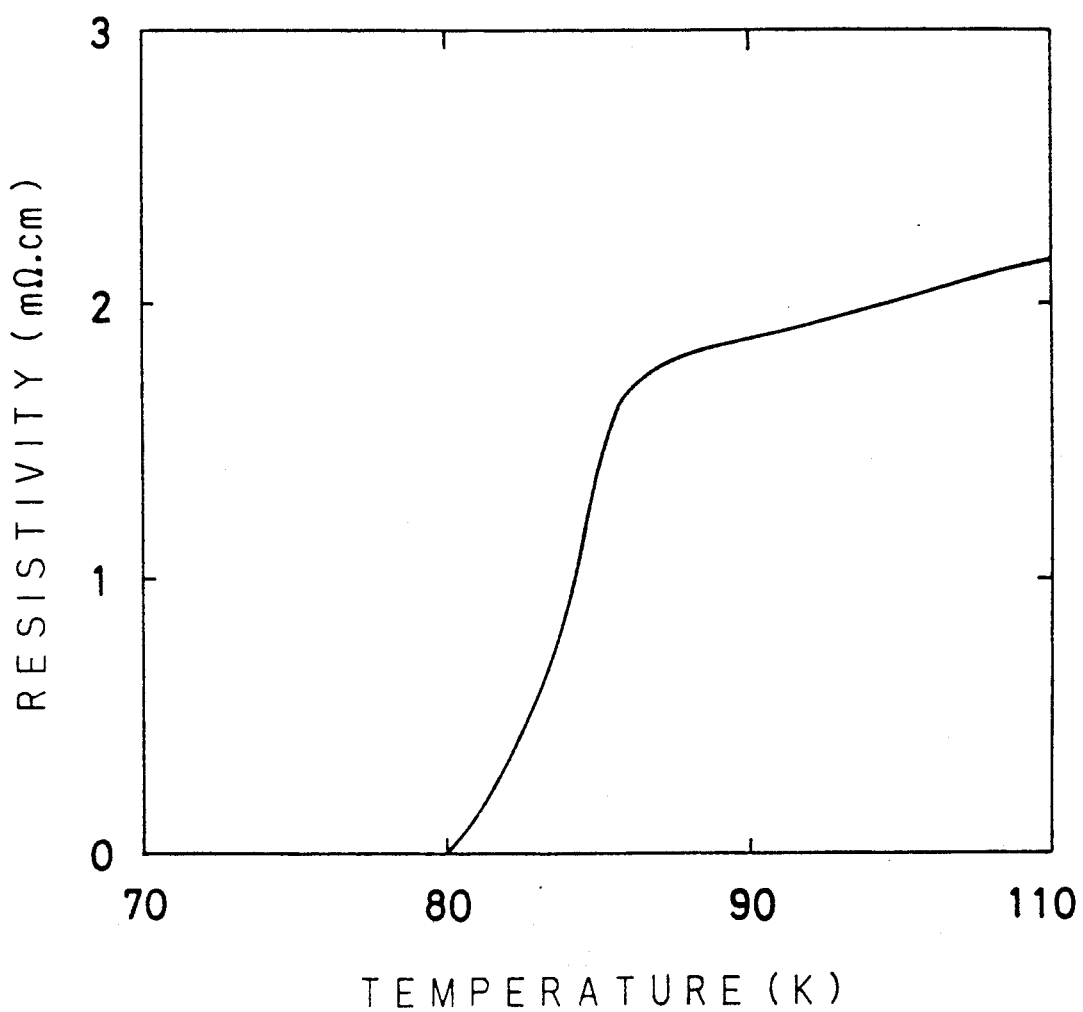
FIG. 1 is a schematic diagram showing the equipment for forming superconducting ceramic films in accordance with the present invention.
Figure 2:
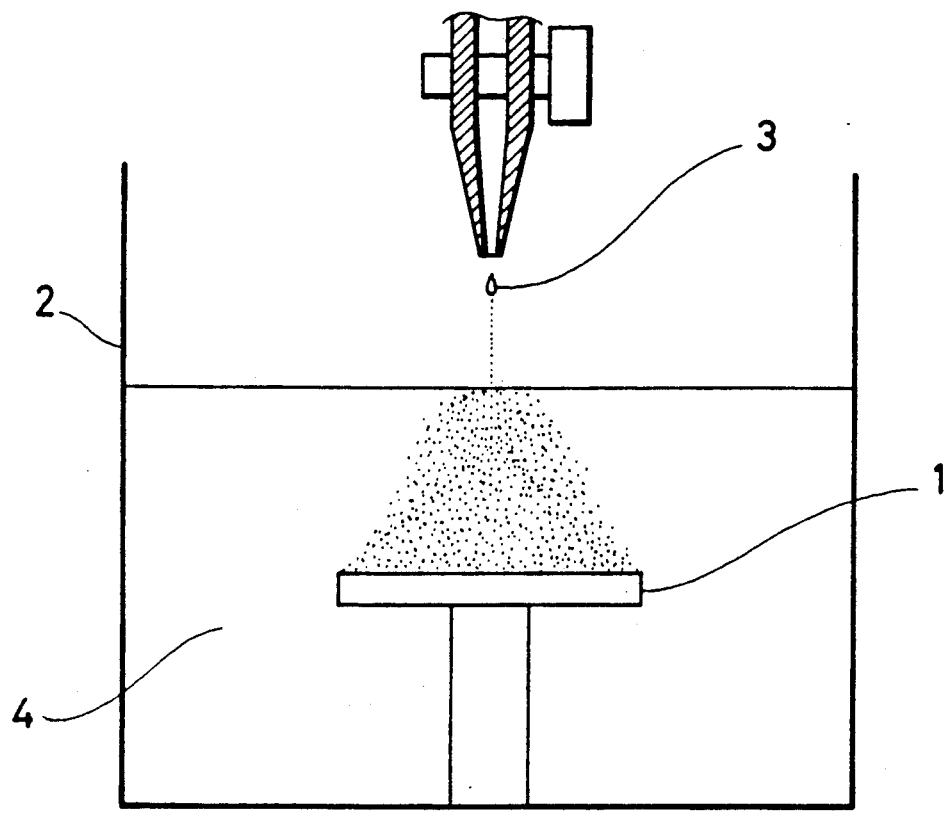
FIG. 2 is a graphical representation of the resistivity of a ceramic superconductor with varying temperature in accordance with the present invention.

On the other hand, a substrate 1 of single crystalline MgO of 10 mm×20 mm×1 mm is placed in ethylalcohol 4 contained in a vessel 2 as illustrated in FIG. 1. The (100) plane of the single crystalline substrate is horizontally arranged in ethylalcohol. An amount of ethylalcohol containing the fine powder is poured into a dripping funnel and dripped to the surface of ethylalcohol at 1 drop/minute for an hour. One drop contains several miligrams of the ceramic powder. As a result, a sediment film was formed on the (100) plane of the substrate 1. Then, ethylalcohol was removed by evaporation.

The film on the surface was fired at 800° C. for 30 minutes in order to obtain strong coherence. Then, a superconducting ceramic film of 200 micrometers thickness was formed. It was confirmed that the c-axes of the crystalline structure of the film are uniformly aligned normal to the coated surface of the substrate. The critical temperature was measured to be 85° K. (Tc onset) and 80° K. (Tco). The critical current density was measured to be 2000 A/cm$^2$ at liquid nitrogen temperature (77° K.) without an external magnetic field. These figures are substantially large as compared with conventional figures. This is considered to be attributed to the fact that superconducting crystals have been aligned. The superconducting state was determined by a reference electric field of 1 microvolt/cm.

While several embodiments have been specifically described by way of examples, it is to be appreciated that the present invention is not limited to the particular examples described and that modifications and variations can be made without departing from the scope of the invention as defined by the appended claims.

What is claimed is:

1. A method of forming a superconducting ceramic film comprising:
   preparing bismuth copper oxide superconducting ceramic material;
   grinding said ceramic material into a fine powder;
   dispersing said powder in an organic solvent liquid contained in a reservoir in which a surface to be coated is horizontally arranged;
   allowing said powder dispersed in said liquid to descend to said surface and form sediment in film form;
   separating said surface from said liquid; and
   firing said surface after it is separated from the liquid to form said superconducting ceramic film.

2. The method of claim 1 wherein said dispersing step is carried out by dispersing said fine powder in an organic solvent liquid and dropping said liquid containing said fine powder to the liquid contained in said reservoir.

3. The method of claim 1 wherein said organic solvent liquid is an alcohol or an acetone.

4. The method of claim 3 wherein said separating step is carried out by evaporation of said liquid.

5. The method of claim 2 wherein said liquids containing said powder and contained in said reservoir are an alcohol.

6. The method of claim 1 wherein said superconducting ceramic material is a Bi/Sr/Ca/Cu/O system.

7. The method of claim 6 wherein said superconducting ceramic material is consistent with the stoichiometric formula of $Bi_2Sr_2CaCu_2O_{8+x}$.

8. The method of claim 1 wherein said surface to be coated comprises MgO.

9. The method of claim 1 wherein said firing occurs at 800° C.

10. A method of forming a superconducting ceramic film comprising:

preparing bismuth copper oxide superconducting ceramic material;

grinding said ceramic material into a fine powder;

dispersing said powder in an organic solvent liquid contained in a reservoir in which a surface to be coated is horizontally arranged;

allowing said powder dispersed in said liquid to descend to said surface and form sediment in film form;

removing said liquid by evaporation; and firing said surface after it is separated from the liquid to form said superconducting ceramic film.

* * * * *